US012784803B2

(12) United States Patent
Hirata et al.

(10) Patent No.: US 12,784,803 B2
(45) Date of Patent: Nov. 3, 2026

(54) MEMORY CONTROL APPARATUS AND METHOD TO REFRESH DRAM BANKS BASED ON ATTRIBUTE INFORMATION

(71) Applicant: CANON KABUSHIKI KAISHA, Tokyo (JP)

(72) Inventors: Naoki Hirata, Kanagawa (JP); Daisuke Shiraishi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 70 days.

(21) Appl. No.: 18/626,390

(22) Filed: Apr. 4, 2024

(65) Prior Publication Data

US 2024/0347095 A1 Oct. 17, 2024

(30) Foreign Application Priority Data

Apr. 14, 2023 (JP) ................................ 2023-066619

(51) Int. Cl.
*G11C 11/406* (2006.01)
*G11C 11/4093* (2006.01)

(52) U.S. Cl.
CPC .. *G11C 11/40615* (2013.01); *G11C 11/40618* (2013.01); *G11C 11/4093* (2013.01)

(58) Field of Classification Search
CPC ........ G11C 11/40615; G11C 11/40618; G11C 11/4093; G11C 11/406; G11C 11/40603; G11C 11/40611
See application file for complete search history.

(56) References Cited

U.S. PATENT DOCUMENTS 11,842,079 B2 12/2023 Ito et al.
12,073,087 B2 * 8/2024 Takizawa .............. G06F 3/0659
2004/0049629 A1 * 3/2004 Miura ................ G06F 11/1068
711/E12.083

FOREIGN PATENT DOCUMENTS

JP 2021047829 A 3/2021

OTHER PUBLICATIONS

Co-pending U.S. Appl. No. 18/628,881 of Fujiwara et al. filed Apr. 8, 2024.

* cited by examiner

*Primary Examiner* — Sultana Begum
(74) *Attorney, Agent, or Firm* — Venable LLP

(57) ABSTRACT

A memory control apparatus that controls access to a DRAM including a plurality of banks, the memory control apparatus comprising: a first generation unit configured to generate an access command in response to an access request for the DRAM, and store the generated access command in a buffer; a second generation unit configured to generate a bank-designated refresh request for the DRAM; and an issuing unit configured to issue a DRAM command to the DRAM based on the access command stored in the buffer and the refresh request generated by the second generation unit, wherein the second generation unit determines a bank to which the refresh request is to be given, from among banks remaining after a bank selected based on attribute information added to the access request has been excluded from the plurality of banks.

8 Claims, 14 Drawing Sheets

| BANK | PRIORITY VALUE (901) | COMMAND SUM TOTAL (902) | COMMAND SUM TOTAL OF OTHER BANKS (903) | PRIORITY ORDER BASED ON COMMAND SUM TOTAL (904) | BANK EXCLUDED FROM REFRESH CANDIDATES (905) | REFRESH PRIORITY (906) |
|---|---|---|---|---|---|---|
| 0 | 1.3 | 5 | 54 | 4 | ✓ | |
| 1 | 1 | 10 | 49 | | | |
| 2 | | 0 | 59 | 1 | | 1 |
| 3 | 1 | 7 | 52 | 5 | | 3 |
| 4 | 0 | 12 | 47 | | | |
| 5 | 2 | 2 | 57 | 2 | ✓ | |
| 6 | 0 | 3 | 56 | 3 | | 2 |
| 7 | 0.1 | 20 | 39 | | | |

NUMBER READ COMMANDS/WRITE COMMANDS THAT CAN BE ISSUED IN PARALLEL TO REFRESH = 50
PRIORITY THRESHOLD = 2

FIG. 4

COMMAND Queue 409 408

| | | | | | |
|---|---|---|---|---|---|
| 401 | ACCESS TYPE | READ | READ | WRITE | WRITE |
| 402 | BANK | 0 | 3 | 2 | 1 |
| 403 | ROW ADDRESS | R0 | R1 | R2 | R1 |
| 404 | COLUMN ADDRESS | C0 | C1 | C2 | C1 |
| 405 | TRANSFER LENGTH | 16 | 64 | 16 | 128 |
| 406 | TRANSFER ID | ID0 | ID0 | ID0 | ID3 |
| 407 | PRIORITY VALUE | 3 | 2 | 1 | 0 |

FIG. 6

REFRESH MANAGEMENT TABLE

| BANK | FLAG |
|---|---|
| 0 | 0 |
| 1 | 0 |
| 2 | 0 |
| 3 | 0 |
| 4 | 0 |
| 5 | 0 |
| 6 | 0 |
| 7 | 0 |

BANK 2 REFRESH →

| BANK | FLAG |
|---|---|
| 0 | 0 |
| 1 | 0 |
| 2 | 1 |
| 3 | 0 |
| 4 | 0 |
| 5 | 0 |
| 6 | 0 |
| 7 | 0 |

BANK 0 REFRESH →

| BANK | FLAG |
|---|---|
| 0 | 1 |
| 1 | 0 |
| 2 | 1 |
| 3 | 0 |
| 4 | 0 |
| 5 | 0 |
| 6 | 0 |
| 7 | 0 |

FIG. 9

| BANK | PRIORITY VALUE (901) | COMMAND SUM TOTAL (902) | COMMAND SUM TOTAL OF OTHER BANKS (903) | PRIORITY ORDER BASED ON COMMAND SUM TOTAL (904) | BANK EXCLUDED FROM REFRESH CANDIDATES (905) | REFRESH PRIORITY (906) |
|---|---|---|---|---|---|---|
| 0 | 1,3 | 5 | 54 | 4 | ✓ | |
| 1 | 1 | 10 | 49 | | | |
| 2 | | 0 | 59 | 1 | | 1 |
| 3 | 1 | 7 | 52 | 5 | | 3 |
| 4 | 0 | 12 | 47 | | | |
| 5 | 2 | 2 | 57 | 2 | ✓ | |
| 6 | 0 | 3 | 56 | 3 | | 2 |
| 7 | 0,1 | 20 | 39 | | | |

NUMBER READ COMMANDS/WRITE COMMANDS THAT CAN BE ISSUED IN PARALLEL TO REFRESH = 50
PRIORITY THRESHOLD = 2

FIG. 11

| BANK | 901 PRIORITY VALUE | 902 COMMAND SUM TOTAL | 903 COMMAND SUM TOTAL OF OTHER BANKS | 904 PRIORITY ORDER BASED ON COMMAND SUM TOTAL | 905 BANK EXCLUDED FROM REFRESH CANDIDATES | 906 REFRESH PRIORITY |
|---|---|---|---|---|---|---|
| 0 | 1,3 | 5 | 54 | 4 | ✓ | |
| 1 | 1 | 10 | 49 | | | |
| 2 | | 0 | 59 | 1 | | 1 |
| 3 | 1 | 7 | 52 | 5 | | 4 |
| 4 | 0 | 12 | 47 | | | |
| 5 | 2 | 2 | 57 | 2 | | 2 |
| 6 | 0 | 3 | 56 | 3 | | 3 |
| 7 | 0,1 | 20 | 39 | | | |

NUMBER READ COMMANDS/WRITE COMMANDS THAT CAN BE ISSUED IN PARALLEL TO REFRESH = 50

FIG. 12

| BANK | TRANSFER ID (1201) | COMMAND SUM TOTAL (902) | COMMAND SUM TOTAL OF OTHER BANKS (903) | PRIORITY ORDER BASED ON COMMAND SUM TOTAL (904) | BANK EXCLUDED FROM REFRESH CANDIDATES (905) | REFRESH PRIORITY (906) |
|---|---|---|---|---|---|---|
| 0 | 1 | 5 | 54 | 4 | ✓ | |
| 1 | 10 | 10 | 49 | | | |
| 2 | | 0 | 59 | 1 | | 1 |
| 3 | 15 | 7 | 52 | 5 | | 4 |
| 4 | 16 | 12 | 47 | | | |
| 5 | 45 | 2 | 57 | 2 | | 2 |
| 6 | 24 | 3 | 56 | 3 | | 3 |
| 7 | 8 | 20 | 39 | | | |

NUMBER READ COMMANDS/WRITE COMMANDS THAT CAN BE ISSUED IN PARALLEL TO REFRESH = 50
AVOID ID = 1

FIG. 14

| BANK | ACCESS TYPE/ TRANSFER ID (1401) | ACCESS COMMAND RECEPTION ORDER (1402) | PRIORITY VALUE (901) | COMMAND SUM TOTAL (902) | COMMAND SUM TOTAL OF OTHER BANKS (903) | PRIORITY ORDER BASED ON COMMAND SUM TOTAL (904) | BANK EXCLUDED FROM REFRESH CANDIDATES (905) | REFRESH PRIORITY (906) |
|---|---|---|---|---|---|---|---|---|
| 0 | READ·0<br>READ·3 | 7<br>8 | 3<br>3 | 5 | 54 | 4 | ✓ | |
| 1 | WRITE·1 | 2 | 1 | 10 | 49 | | | |
| 2 | | | | 0 | 59 | 1 | | 1 |
| 3 | READ·3 | 5 | 1 | 7 | 52 | 5 | | 3 |
| 4 | WRITE·0 | 6 | 0 | 12 | 47 | | | |
| 5 | READ·0 | 1 | 0 | 2 | 57 | 2 | ✓ | |
| 6 | WRITE·3 | 7 | 0 | 3 | 56 | 3 | | 2 |
| 7 | READ·2<br>READ·4 | 3<br>4 | 0<br>1 | 20 | 39 | | | |

NUMBER READ COMMANDS/WRITE COMMANDS THAT CAN BE ISSUED IN PARALLEL TO REFRESH = 50

MEMORY CONTROL APPARATUS AND METHOD TO REFRESH DRAM BANKS BASED ON ATTRIBUTE INFORMATION

BACKGROUND OF THE INVENTION

Field of the Invention

The present invention relates to a memory control apparatus and a memory control method.

Description of the Related Art

Dynamic random access memories (DRAMs) are widespread and employed as main storage devices of computer systems. Due to the increasing speed and functionality of computer systems, demand for DRAM access performance is increasing and DRAMs that operates at a higher speed are being developed. Meanwhile, DRAMs are memory devices that need refresh (memory holding operation) to continuously hold data. In DRAMs complying with up to the DDR2 standard, all banks are simultaneously refreshed on a regular basis and memory access during the refresh is prohibited, resulting in a factor of deterioration in memory access performance.

To suppress deterioration in memory access performance due to refresh, in the LPDDR2 standard, a function of performing refresh per DRAM bank has been added. Also, in the LPDDR4 standard, a function of designating a refresh bank when performing per-bank refresh has been added. Japanese Patent Laid-Open No. 2021-047829 discloses a memory controller that controls a memory including a plurality of banks, in which a bank is selected based on the state of memory access of the bank and refresh is performed on the selected bank. According to Japanese Patent Laid-Open No. 2021-047829, deterioration in memory access efficiency due to refresh is reduced or prevented.

The refresh control method disclosed in Japanese Patent Laid-Open No. 2021-047829 is silent about memory access to which priority is given by an initiator. Accordingly, a case may arise in which a bank to which memory access should be executed with a higher priority than other banks coincides with a bank that needs to be refreshed. As a result, the memory access that should be executed with a high priority will be delayed, causing a situation in which latency requirements and the like cannot be satisfied.

SUMMARY OF THE INVENTION

The present invention was made in view of the above-described problem and provides a technique for controlling issuance of refresh requests so as to enable more efficient memory access.

According to one aspect of the present invention, there is provided a memory control apparatus that controls access to a DRAM including a plurality of banks, the memory control apparatus comprising: a first generation unit configured to generate an access command in response to an access request for the DRAM, and store the generated access command in a buffer; a second generation unit configured to generate a bank-designated refresh request for the DRAM; and an issuing unit configured to issue a DRAM command to the DRAM based on the access command stored in the buffer and the refresh request generated by the second generation unit, wherein the second generation unit determines a bank to which the refresh request is to be given, from among banks remaining after a bank selected based on attribute information added to the access request has been excluded from the plurality of banks.

Further features of the present invention will become apparent from the following description of exemplary embodiments (with reference to the attached drawings).

BRIEF DESCRIPTION OF THE DRAWINGS

FIG. 4 is a diagram illustrating examples of access commands.

FIG. 6 is a diagram illustrating examples of refresh management tables.

FIG. 9 is a diagram illustrating a method for determining refresh candidates according to a first embodiment.

FIG. 11 is a diagram illustrating a method for determining refresh candidates according to a second embodiment.

FIG. 12 is a diagram illustrating a method for determining refresh candidates according to a third embodiment.

FIG. 14 is a diagram illustrating a method for determining refresh candidates according to the fourth embodiment.

DESCRIPTION OF THE EMBODIMENTS

Figure 1:
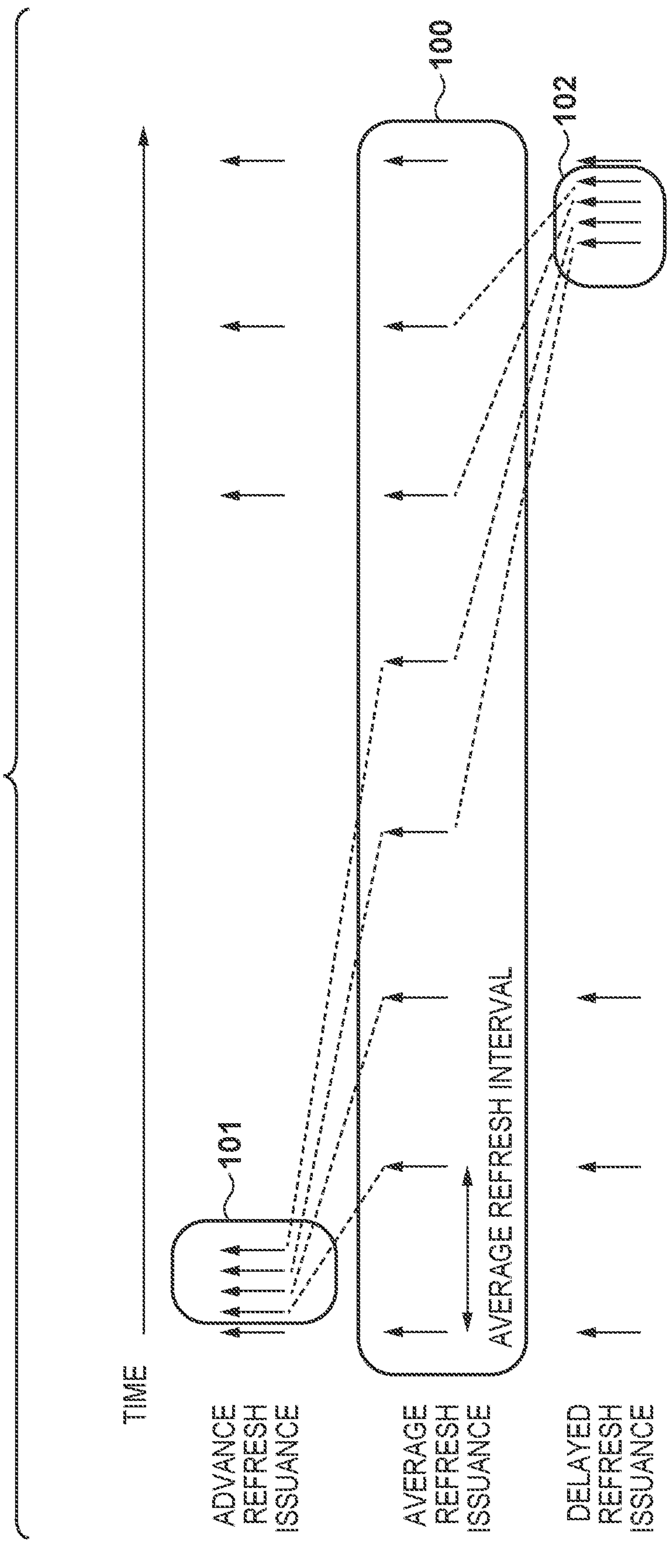
FIG. 1 is a diagram illustrating issuance of DRAM refreshes.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

First Embodiment

In the following embodiments, descriptions are given taking, as an example of a memory control apparatus, a DRAM control apparatus that controls DRAM access complying with LPDDR4.

DRAM Refresh

First, refresh operation needed for a DRAM to continuously hold data is described. FIG. 1 is a diagram illustrating issuance of DRAM refreshes.

A DRAM can hold data by performing refresh at every average refresh interval defined according to the specification, as in a case of an average refresh issuance 100. Common command signals are used for refresh and memory access of a DRAM. Also, there are many timing restrictions for issuance of commands other than refreshes, and thus it is difficult to perform refresh at an average refresh interval on a consistent basis.

Also, as in a case of an advanced refresh issuance 101, a DRAM allows refreshes to be issued at timings earlier than the respective timings of the average refresh issuance. Also, as in a case of a delayed refresh issuance 102, a DRAM allows refreshes to be issued at timings later than the respective timings of the average refresh issuance. The number of refreshes allowed to be issued at earlier timings and the number of refreshes allowed to be issued at later timings are defined by the specification, and the DRAM control apparatus can change the refresh issuance timings within this allowable range.

Figure 2A:
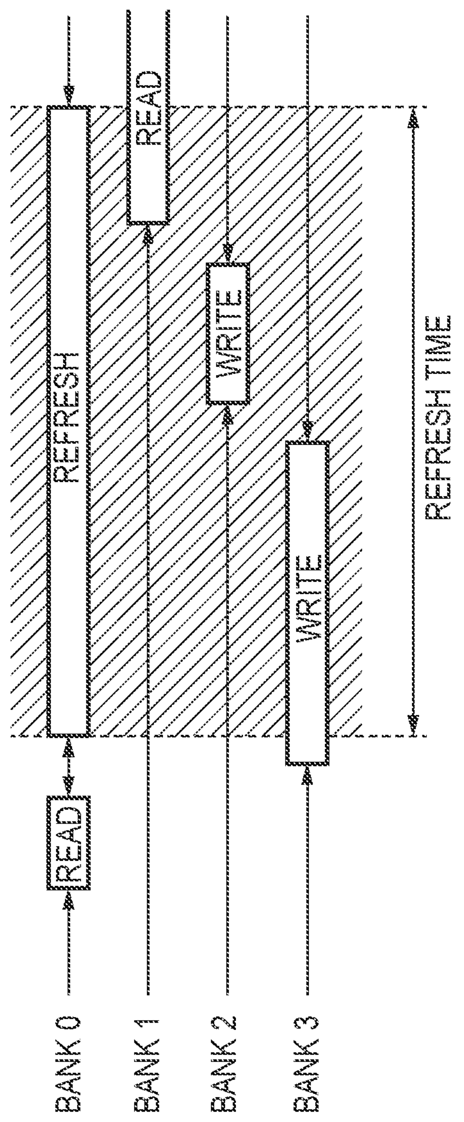
FIGS. 2A and 2B are diagrams illustrating bank-designated refresh.
Figure 2B:
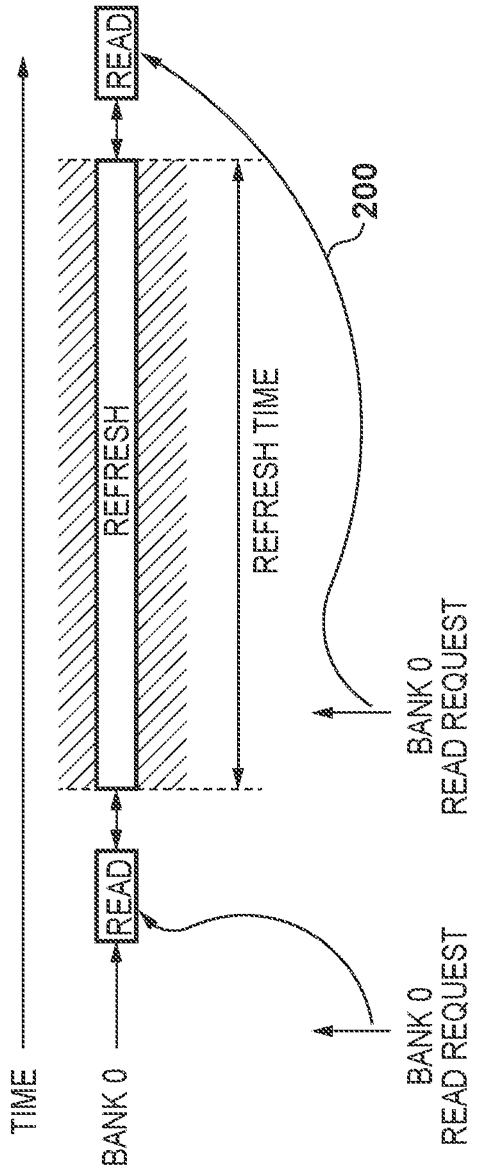

FIGS. 2A and 2B are diagrams illustrating bank-designated refresh. FIG. 2A shows refresh in which Bank 0 is designated. In bank-designated refresh, during execution of refresh of a designated bank, other banks can be subjected to memory access such as read operation and write operation. On the other hand, as shown in FIG. 2B, the bank that is being refreshed cannot be subjected to memory access. Accordingly, if a memory access request is given to the refresh bank, memory access will be executed after the completion of the refresh (an arrow 200). In this way, bank-designated refresh enables, during refresh of a bank, other banks to be subjected to memory access. Note however that in order to use the memory bandwidth more efficiently, it is necessary to perform control in a manner such that a refresh bank does not coincide with a bank for memory access.

Apparatus Configuration

Figure 3:
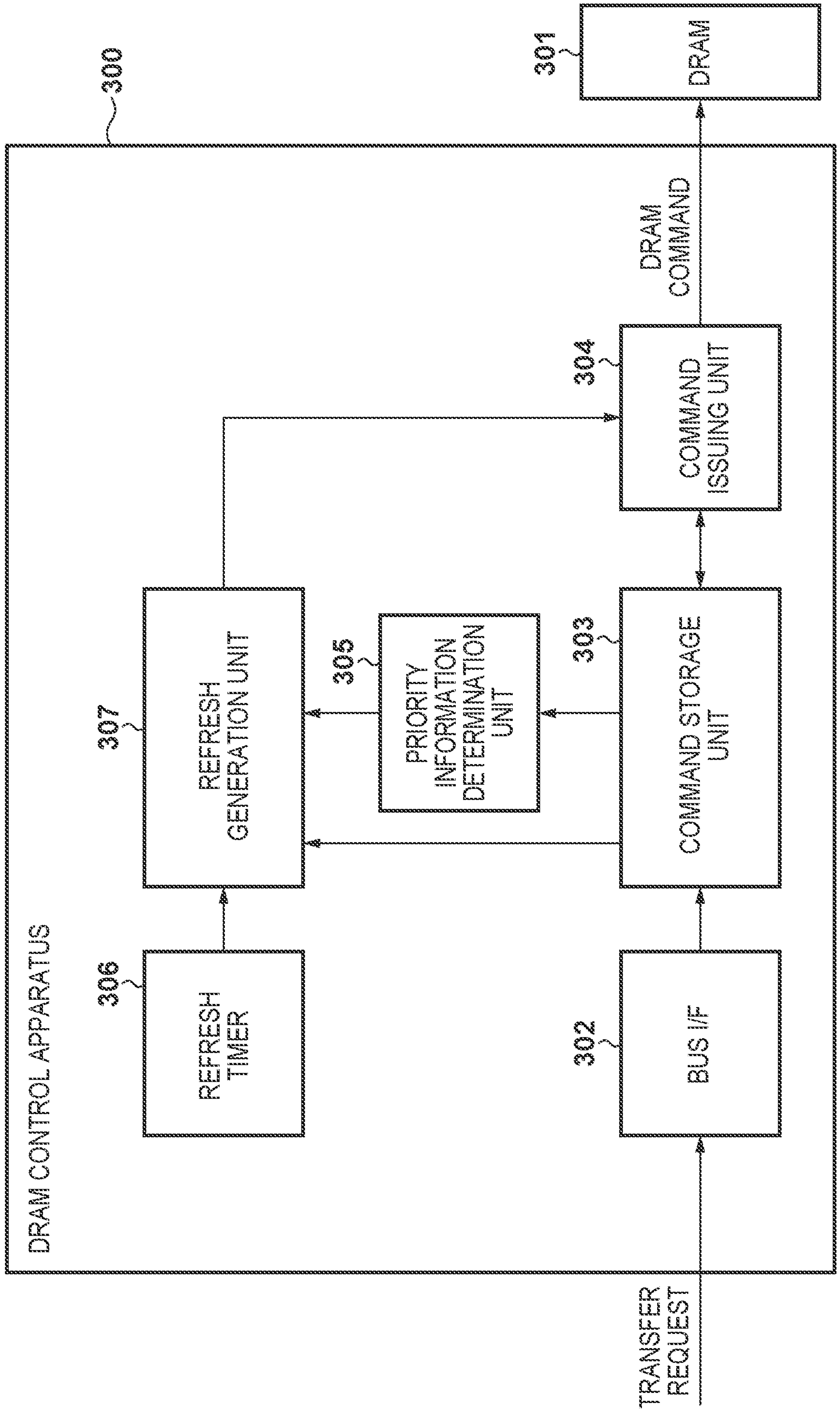
FIG. 3 is a diagram illustrating a configuration of a DRAM control apparatus according to the present invention.

FIG. 3 is a diagram illustrating an example of a configuration of a DRAM control apparatus according to the first embodiment. A DRAM control apparatus 300 issues a DRAM command to a DRAM 301 in response to a memory access request issued by an initiator (not shown).

A bus interface (hereinafter, abbreviated as bus I/F) 302 receives a memory access request issued by the initiator, converts it into an access command per row address designating an area, called a page, of the DRAM 301, and transmits it to a command storage unit 303. The command storage unit 303 includes a buffer that holds a plurality of access commands generated by the bus I/F 302. When an access command has been stored in the buffer, the command storage unit 303 notifies the command issuing unit 304 of completion of preparation for command transmission, and upon receiving a response from the command issuing unit 304, the command storage unit 303 transmits the access command to the command issuing unit 304. Note that a configuration is also possible in which the order of received memory access requests is changed to improve the efficiency in DRAM access or realize memory access requests according to the degrees of urgency. Also, the change in the order of received memory access requests may be realized by changing the order of storing access commands into the buffer.

A priority information determination unit 305 monitors access command priority information stored in the command storage unit 303 and notifies a refresh generation unit 307 of the priority information. The access command priority information will be described later with reference to FIG. 4. A refresh timer 306 is a timer that counts an elapse of an average refresh timer period and notifies a refresh generation unit 307 of the elapse of the average refresh timer period. The refresh generation unit 307 generates a bank-designated refresh request based on the pieces of information received from the priority information determination unit 305 and the refresh timer 306, and notifies the command issuing unit 304 of the refresh request.

The command issuing unit 304 generates a DRAM access command for accessing the DRAM 301 based on the access command per row address received from the command storage unit 303. Also, the command issuing unit 304 generates a refresh command for refreshing the DRAM 301 in response to the per-bank refresh request generated by the refresh generation unit 307. Also, the command issuing unit 304 issues the DRAM command (a DRAM access command or a refresh command) to the DRAM 301 by adjusting the timing of issuing the DRAM access command or the refresh command.

FIG. 4 is a diagram showing examples of access commands per row address that are stored in the command storage unit 303. An access command includes an access type 401, a bank 402, a row address 403, a column address 404, a transfer length 405, a transfer ID 406, and a priority value 407. The access type 401 indicates the access command type, namely, read or write. The bank 402 indicates the bank which the access command is to access. The row address 403 and the column address 404 respectively indicate the row address and the column address which the access command is to access. Note that in the following, the row address 403 and the column address 404 are referred to collectively as address information. The transfer length 405 indicates the length of data to be read from the DRAM 301 or written into the DRAM 301 through memory access, and is also referred to as "burst length". Typically, 16 bursts (2 bites per one burst) are transferred per one access command. Accordingly, when the transfer length 405 is "16", it means that 16 bursts are to be transferred, and when the transfer length 405 is "64", it means that 64 bursts are to be transferred.

The transfer ID 406 and the priority value 407 are information to be added to a memory access request when issued by an initiator (not shown). For example, if the initiator executes a plurality of tasks and issues a memory access for each of the tasks, adding a transfer ID specific for each task allows the initiator to recognize the relationship between the memory access and the task. In the command storage unit 303, access commands per row address generated by the bus I/F 302 are stored. The priority value 407 indicates the priority of memory access requests using numerical values such as 1, 2, 3, and the like. In the present example, the greater the numerical value is, the higher the priority is.

Operation of Apparatus

Figure 5:
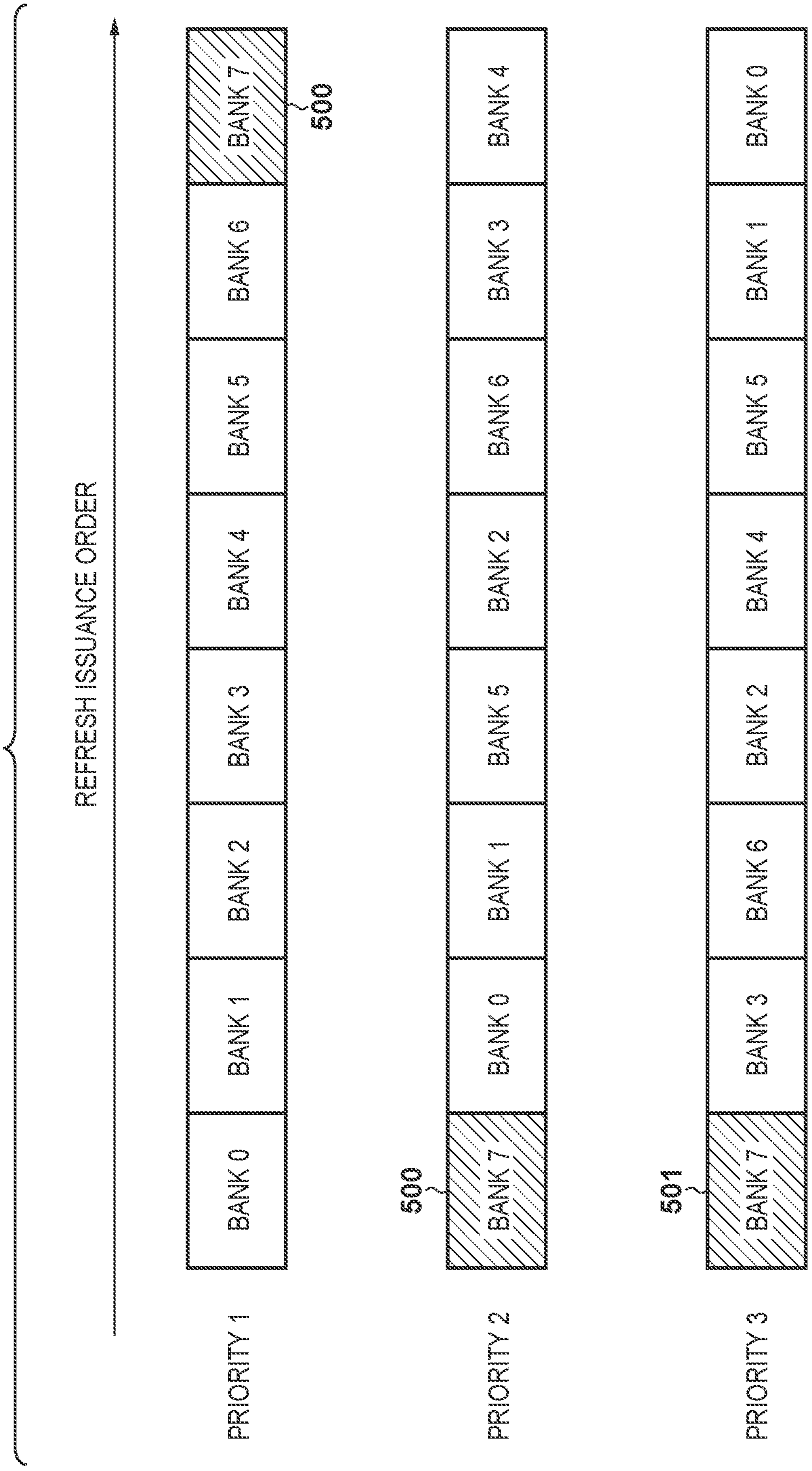
FIG. 5 is a diagram illustrating restriction of bank-designated refresh.

FIG. 5 is a diagram illustrating restriction of bank-designated refresh in LPDDR4. In LPDDR4, bank-designated refresh is enabled, but there is a restriction in the order of banks to be designated. In LPDDR4, a refresh bank can be designated, but all the banks need to be refreshed uniformly. Accordingly, there is a restriction that a second refresh cannot be issued for each bank until all banks have been refreshed once. In a DRAM with an 8-bank configuration, if a bank is focused, the bank can be refreshed twice in a row (timing 500) in the shortest time. However, if the same bank is refreshed twice in a row in this way, the next refresh will be at eighth timing (timing 501) from that in the shortest time.

FIG. 6 is a diagram illustrating examples of refresh management tables. The refresh management tables are used to satisfy the above-described restriction of bank-designated refresh of LPDDR4. As shown in FIG. 6, a configuration is such that, when a refresh of a bank is issued, the flag of that bank is set (Flag=1), and the next refresh bank is selected from banks whose flags are not set (Flag=0). Note that, if a refresh is issued to all banks and the flags of all banks are set (Flag=1), the flags of all the banks are reset and a state is realized in which a refresh can be issued to all the banks.

Figure 7:
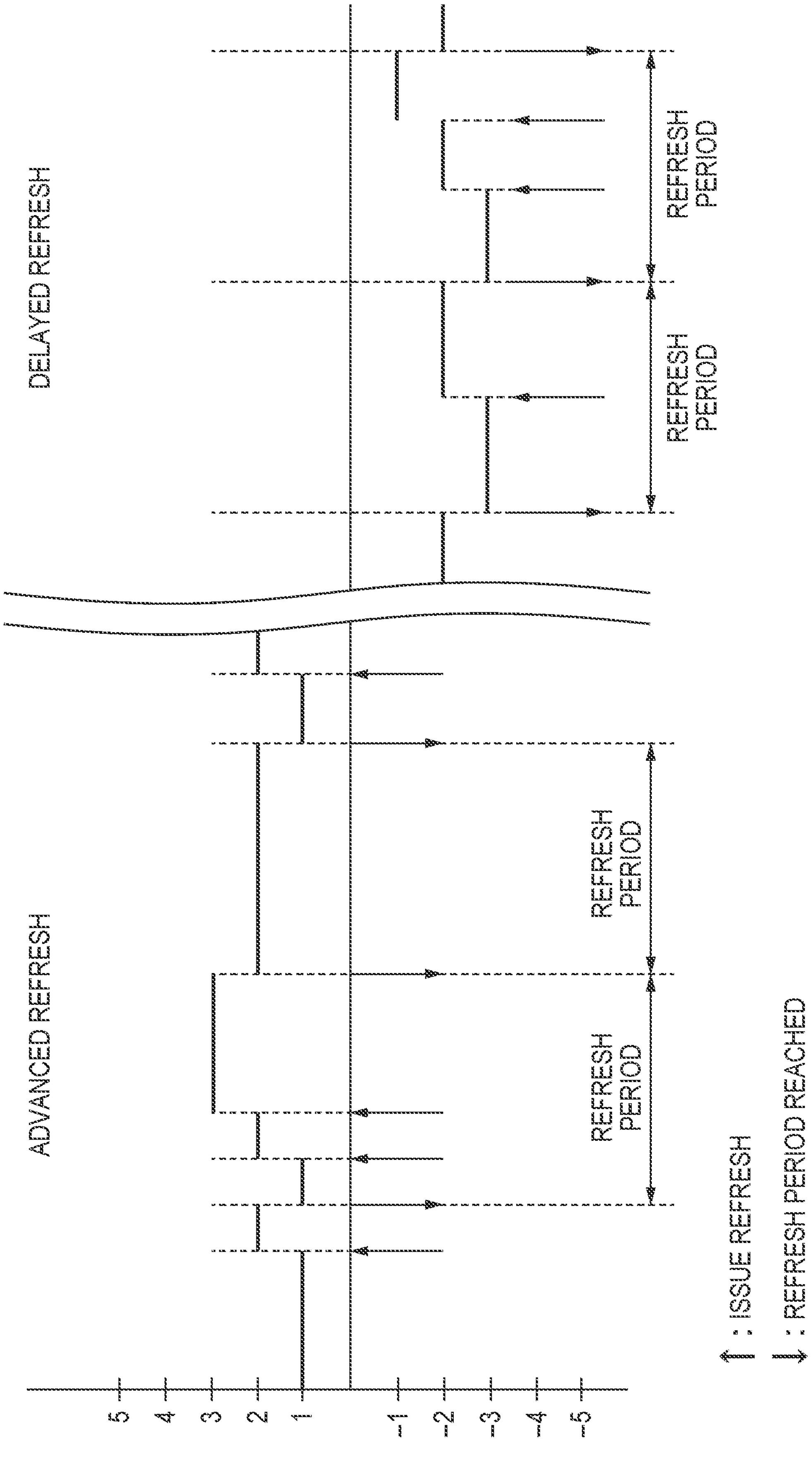
FIG. 7 is a diagram illustrating a refresh state counter.

FIG. 7 is a diagram illustrating a refresh state counter included in the refresh generation unit 307. The refresh state counter is a counter that detects whether the refresh issuance situation of the DRAM is the advanced refresh state or the delayed refresh state. The horizontal axis of FIG. 7 shows that time passes toward the right. During the passage of time, a timing at which a refresh command is issued to the DRAM 301 is indicated by an upward arrow, and a timing at which a periodic time to issue a refresh has elapsed is indicated by a downward arrow. The vertical axis of FIG. 7 shows how the count value of the refresh state counter changes over time. The refresh state counter is configured to count up when a refresh command has been issued to the DRAM and count down when the refresh period has elapsed. Therefore, when the counter value indicates a positive value, the DRAM is in the advanced refresh state, and when the counter value indicates a negative value, the DRAM is in the delayed refresh state.

Figure 8:
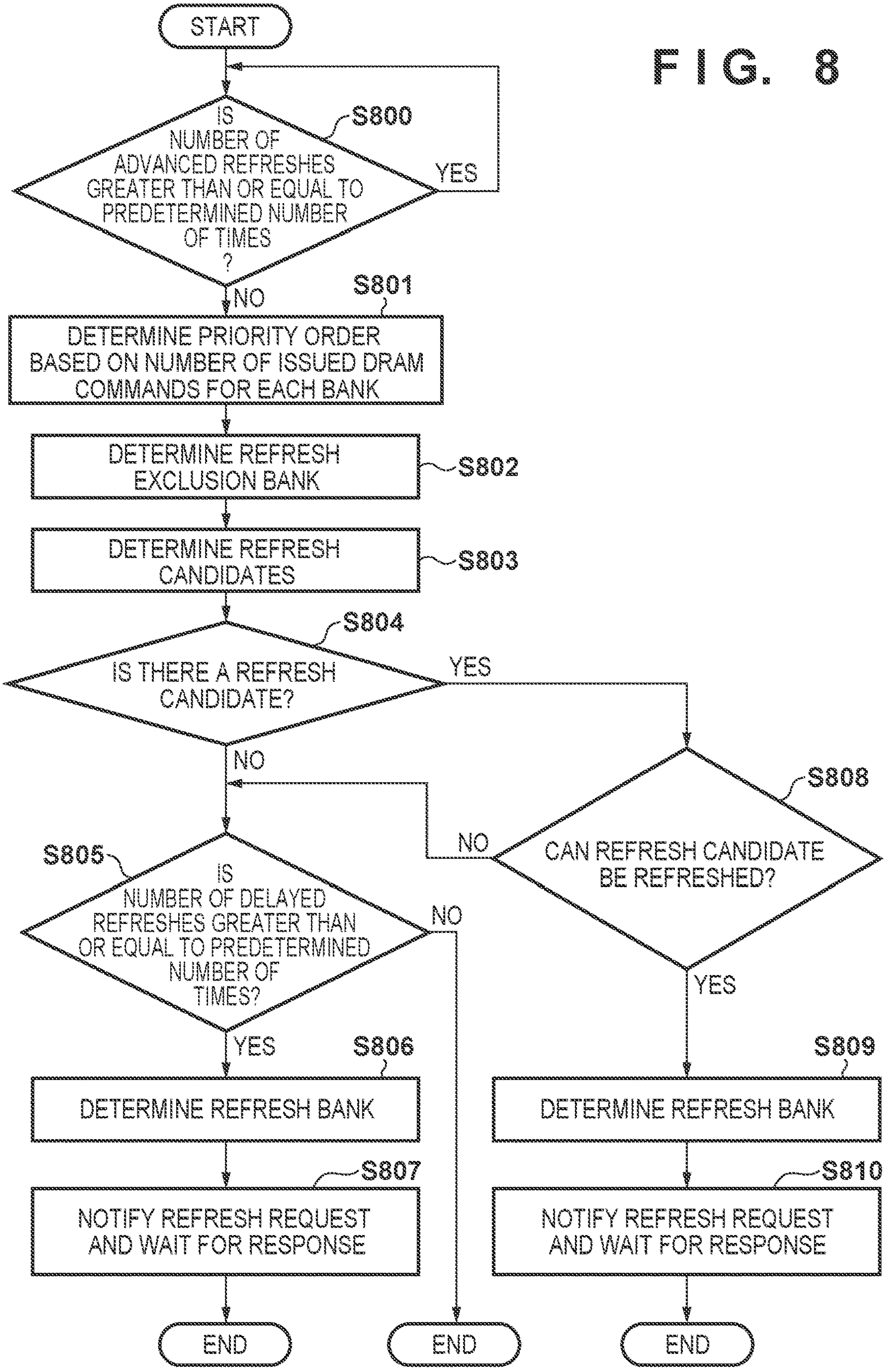
FIG. 8 is a flowchart illustrating how to generate a refresh request.

FIG. 8 is a flowchart of refresh request generation processing executed by the refresh generation unit 307. To select banks to be refreshed in a manner such that memory access performance is not deteriorated, the refresh generation unit 307 narrows down banks serving as candidates to be refreshed with reference to attribute information added to memory access. In the processing example described below, the refresh generation unit 307 obtains the number of commands for each bank based on the access commands stored in the command storage unit 303 and selects banks serving as candidates to be refreshed based on the obtained number of commands. Then, the refresh generation unit 307 further narrows down the refresh candidates based on attribute information (e.g., priority value) added to the access commands.

In step S800, the refresh generation unit 307 determines whether or not the number of advanced refreshes is greater than or equal to a predetermined number of times, and if the number of advanced refreshes is greater than the predetermined number of times, the refresh generation unit 307 repeats the determination. If the number of advanced refreshes is less than the predetermined number of times, the procedure moves to step S801. This is because the DRAM specification specifies that the number of advanced refreshes should be less than the predetermined number of times, and refresh needs to be stopped if the number of advanced refreshes is greater than or equal to the predetermined number of times. Note that, as described above, the refresh generation unit 307 recognizes, using the refresh state counter, whether the current refresh issuance situation is the advanced refresh state or the delayed refresh state. If the counter value of the refresh state counter is a positive value, this counter value is used as the number of advanced refreshes.

Steps S801 to S803 indicate an example of processing for determining refresh candidates by the refresh generation unit 307. In step S801, the refresh generation unit 307 selects banks to be refreshed (refresh candidates) based on the number of DRAM commands for each bank and determines the order of priority. More specifically, the refresh generation unit 307 calculates the sum total of the number of commands for each bank based on address information and information on the transfer length of the access commands stored in the command storage unit 303. Note that the number of commands is a numerical value obtained taking into consideration the transfer length of an access command, and will be described in detail later. Based on the number of commands obtained by this calculation, the refresh generation unit 307 selects banks serving as refresh candidates and determines the order of priority. Selection of refresh candidates and determination of the order of priority based on the number of commands will be described later with reference to FIG. 9.

In step S802, the refresh generation unit 307 determines, from among the banks (prioritized banks) selected as refresh candidates in step S801, a refresh exclusion bank based on the priority value of the access command. The priority value is as described with reference to FIG. 4, is obtained by the priority information determination unit 305, and is given to the refresh generation unit 307. In the present embodiment, as an example, a case is described in which a bank to be accessed by an access command having the priority value of 2 or more is defined as a refresh exclusion bank.

In step S803, the refresh generation unit 307 determines refresh candidates. More specifically, the refresh generation unit 307 determines, as the refresh candidates, banks remaining after the bank determined as the refresh exclusion bank in step S802 has been excluded from the refresh candidates (prioritized banks) selected in step S801. The refresh generation unit 307 sets the priority for the determined refresh candidate banks in accordance with the order of priority determined in step S801. Thus, the refresh generation unit 307 determines the refresh candidates based on the sum total of read commands and write commands for each bank, the sum total of read commands and write commands of the banks other than a focused bank, and the priority value. A specific example of the above-described processing from steps S801 to S803 will be described later with reference to FIG. 9.

In step S804, the refresh generation unit 307 determines whether or not there is any refresh candidate. If it is determined that there is any refresh candidate (Yes, in step S804), the procedure moves to step S808. On the other hand, if it is determined that there is no refresh candidate (No, in step S804), the procedure moves to step S805 since it is necessary to wait for issuance of a refresh or determine whether or not to issue a refresh.

In step S805, the refresh generation unit 307 determines whether or not the number of delayed refreshes is greater than or equal to a predetermined number of times, with reference to the counter value of the refresh state counter. This is because the DRAM specification specifies the number of delayed refreshes. If the counter value of the refresh state counter is a negative value, this counter value is used as the number of delayed refreshes. If it is determined that the number of delayed refreshes is greater than or equal to the predetermined number of times (Yes, in step S805), the procedure moves to step S806. On the other hand, if it is determined that the number of delayed refreshes is less than the predetermined number of times (No, in step S805), the refresh generation unit 307 does not need to urgently issue a refresh command and ends the procedure without generating any refresh.

In step S806, the refresh generation unit 307 determines a refresh bank. The refresh generation unit 307 checks the refresh management tables described with reference to FIG. 6, selects one of the banks to which no flag is set (banks with Flag=0), and determines the selected bank as a refresh bank. In step S807, the refresh generation unit 307 generates a refresh request to the refresh bank, notifies the command issuing unit 304 of the refresh request, and waits for a response from the command issuing unit 304. Upon receiving the refresh request, the command issuing unit 304 notifies the refresh generation unit 307 of a response to the refresh request, and issues a refresh command for the refresh bank. The refresh generation unit 307 ends this procedure upon receiving the notification of the response from the command issuing unit 304.

In step S808, the refresh generation unit 307 determines whether or not the refresh candidate is able to be refreshed. That is to say, the refresh generation unit 307 checks the refresh management tables described with reference to FIG. 6, and determines, from among the refresh candidates determined in step S803, a bank serving as a refresh candidate to which no flag is set (banks with Flag=0) as a bank that is able to be refreshed. If there is one or more refresh candidates determined to be able to be refreshed (Yes, in step S808), the procedure moves to step S809. On the other hand, if there is no refresh candidate determined to be able to be refreshed, that is, all the refresh candidates are determined not to be able to be refreshed (No, in step S808), the procedure moves to step S805 in order to determine whether or not a delayed refresh needs to be issued. The procedure in steps S805 onward is as described above.

In step S809, the refresh generation unit 307 determines a refresh bank, which is to be refreshed, from among the refresh candidates determined to be able to be refreshed in step S808. For example, the refresh candidate to which the highest order of priority is added can be determined as the refresh bank. In step S810, the refresh generation unit 307 generates a refresh request to the refresh bank determined in step S809, notifies the command issuing unit 304 of the refresh request, and waits for a response from the command issuing unit 304. The processing in step S810 is the same as the processing in step S807. The refresh generation unit 307 ends this procedure upon receiving the response from the command issuing unit 304.

FIG. 9 is a diagram illustrating a specific example of a method (processing in steps S801 to S803) for determining refresh candidates by the refresh generation unit 307. The refresh generation unit 307 calculates a sum total 902 of read commands and write commands for each bank, based on address information and information on the transfer length of the access commands stored in the command storage unit 303. Also, the refresh generation unit 307 calculates, for each bank, a sum total 903 of read commands and write commands to other banks. For example, in the example of FIG. 9, the sum total 902 of read commands and write commands that are to access Bank 0 is equal to "5", and the sum total 903 of read commands and write commands that are to access the other banks (other than Bank 0, that is, Banks 1 to 7) is equal to "54". Note that the sum total 902 and the sum total 903 are sum totals of the numbers of read commands and write commands, and the transfer lengths of the access commands are reflected on the number of commands. In the present embodiment, 16 bursts (2 bits/burst) are set for one access command and, for example, one access command having the transfer length of 64 bursts is counted as four commands (64/16=4). In other words, the number of commands of an access command having the transfer length of 16 bursts is equal to 1, and the number of commands of an access command having the transfer length of 64 bursts is equal to 4. The number of commands corresponds to the length of time required for the access command to be executed.

The refresh generation unit 307 selects, based on the sum total 903, refresh candidates and determines a priority order 904. In the present embodiment, the banks whose sum total 903 is greater than or equal to a predetermined number are selected as refresh candidates. For example, N is assumed to be the number of read commands and write commands that, while a bank is being refreshed, can be issued to other banks. In this case, if banks whose sum total 903 of read commands and write commands to other banks is greater than or equal to N are selected as refresh banks, read commands and write commands to other banks can be issued continuously in parallel with the refresh. In other words, it is possible to suppress degradation in memory access performance due to refresh. Accordingly, banks whose sum total 903 of read commands and write commands to other banks is greater than or equal to N are selected as refresh candidates. In the present example, the predetermined number N is defined as 50, and banks whose sum total 903 of commands to other banks is greater than or equal to "50" are defined as refresh candidates.

Also, the priority order 904 is given to the refresh candidates (banks whose sum total 903 of commands to other banks is greater than or equal to N namely, "50") in the descending order of the sum total 903 of commands to other banks. In the example of FIG. 9, from among the refresh candidates, "Bank 2", which has the largest sum total 903 of commands to other banks, has the highest order of priority. Also, from among the refresh candidates, "Bank 3", which has the smallest sum total 903, has the lowest order of priority. Note that Banks 1, 4, and 7 whose sum total 903 is less than "50" are not selected as refresh candidates and no priority order 904 is given to these banks. This is because, if any of these banks is refreshed, all of read commands and write commands that can be issued to other banks will be issued during the refresh, and read commands and write commands can no longer be issued until the refresh is complete.

On the other hand, the priority information determination unit 305 checks the priority value in the command storage unit 303, and notifies the refresh generation unit 307 of the priority value of access commands to each bank. The refresh generation unit 307 holds the priority value given from the priority information determination unit 305 as a priority value 901. Note that the priority value 901 of "1, 3" of Bank 0 indicates that the commands of Bank 0 include a command with the priority value of 1 and a command with the priority value of 3. Note that a configuration is also possible in which the priority information determination unit 305 notifies the refresh generation unit 307 of the largest value of the priority values of access command for each of the banks. In this case, for the priority value 901 in FIG. 9, the priority value of Bank 0 is held as "3" and the priority value of Bank 7 is held as "1".

The refresh generation unit 307 excludes, from the refresh candidates, banks to be accessed by access commands whose priority value 901 is greater than or equal to a threshold. In this example, a case is described in which the priority value threshold for use in exclusion from refresh candidates is set to "2". In the example of FIG. 9, Bank 0 and Bank 5 include access commands having the priority value of 2 or more. Accordingly, Bank 0 and Bank 5 (exclusion banks 905) are excluded from the refresh candidates. With the above-described processing, the refresh generation unit 307 eventually gives the refresh priority values to "Bank 2", "Bank 6", and "Bank 3" in the descending order, and sets these banks as eventual refresh candidates (refresh priority 906).

Note that when the buffer of the command storage unit 303 is empty, there is no memory access and there is no need of taking into consideration degradation in memory access performance due to refresh, and thus all banks are set as refresh candidates. Also, no degradation in memory access performance occurs no matter to which of the three banks (Bank 2, Bank 3, and Bank 5) a refresh is issued. Therefore, there is no need to give the refresh priority 906.

Figure 10:
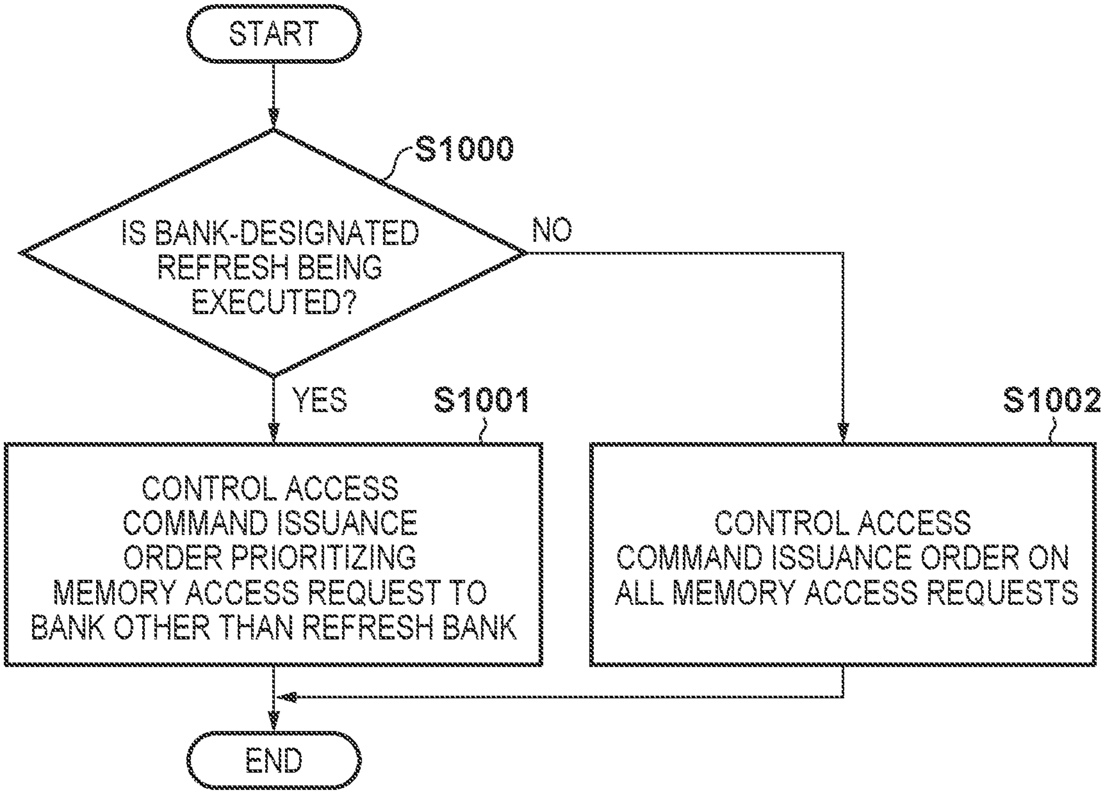
FIG. 10 is a flowchart illustrating how to control the order of access command issuance.

FIG. 10 is a flowchart illustrating how to control the order of issuance of access commands in the DRAM control apparatus 300. The DRAM control apparatus 300 can have a function (issuance order control function) of changing the order of received memory access requests. This issuance order control function can be used to improve the efficiency in DRAM access and realize memory access requests according to the degrees of urgency. Therefore, in the present embodiment, methods of controlling the order of issuance of memory access requests are switched based on whether or not bank-designated refresh is being executed. The processing of FIG. 10 is started when the command issuing unit 304 is notified of the fact that an access command has been stored, and when the state of the DRAM has been changed due to issuance of a DRAM command.

In step S1000, the command storage unit 303 monitors a refresh request and a response between the refresh generation unit 307 and the command issuing unit 304 to determine whether or not bank-designated refresh is being executed. Of course, the method of recognizing whether or not bank-designated refresh is being executed is not limited to this, and the command storage unit 303 may also determine whether or not bank-designated refresh is being executed, based on the state of the command issuing unit 304. If it is determined that bank-designated refresh is being executed (Yes, in step S1000), the procedure moves to step S1001, and if it is determined that bank-designated refresh is not being executed (No, in step S1000), the procedure moves to step S1002.

In step S1001, in the access command issuance order control, the command storage unit 303 performs control such that the memory access requests to banks other than a refresh bank are prioritized. For example, the command storage unit 303 performs control such that no memory access request to a bank (refresh bank) that is being refreshed is output to the command issuing unit 304. More specifically, the command storage unit 303 excludes an access command for accessing a bank that is being refreshed, from issuance order control targets. In step S1002, in the access command issuance order control, the command storage unit 303 performs issuance order control on all of the memory access requests. Note that in the access command issuance order control, memory access requests that do not deteriorate any memory access performance are prioritized, but it is also possible that a memory access request having a high priority value is prioritized. It is clear that the issuance order control described with reference to FIG. 10 is applicable to second to fourth embodiments below.

As describe above, according to the first embodiment, bank-designated refresh is executed by selecting banks so that memory access for which the priority value is greater than or equal to a threshold is not affected. Also, the order of memory access requests is changed according to the refresh execution status. With this configuration, more efficient memory access can be realized and it is possible to suppress degradation in performance of memory access with a high priority value due to refresh.

Second Embodiment

In the first embodiment, the refresh generation unit 307 excludes, from refresh candidates, banks to be accessed by access commands whose priority value is greater than or equal to a threshold and determines banks to be refreshed. The second embodiment describes a configuration in which the refresh generation unit 307 excludes, from refresh candidates, banks to be accessed by access commands with the largest priority value in the command storage unit 303. Note that the configuration of the DRAM control apparatus 300 and the processing performed by the refresh generation unit 307 in the second embodiment are the same as those in the first embodiment (FIGS. 3 and 8).

FIG. 11 is a diagram illustrating processing (steps S801 to S803 and S809) for determining refresh candidates by the refresh generation unit 307 according to the second embodiment. In the second embodiment, similar to the first embodiment, the refresh priority order 904 is determined based on the sum total 903 of read commands and write commands to other banks. However, in the second embodiment, banks to be accessed by access commands with the largest value are excluded from refresh candidates. Referring to the priority values 901 in the example of FIG. 11, the access command that is to access Bank 0 includes an access command with the priority value of 3, which is the largest priority value. Accordingly, as shown in the exclusion bank 905, Bank 0 is excluded from the refresh candidates. As a result, "Bank 2" that is not to be accessed by the access command with the largest priority value has the highest refresh priority, and thereafter, "Bank 5", "Bank 6", and "Bank 3" are to be refreshed in this order (refresh priority 906).

As described above, in FIG. 11, Bank 5 has the priority value 901 of "2" so Bank 5 is excluded in the first embodiment (FIG. 10) but is not excluded in the second embodiment. Note that if there are a plurality of banks including the access command with the largest priority value, these banks are excluded from refresh candidates. For example, in FIG. 11, if the priority value 901 of Bank 0 is "1, 2", Bank 0 and Bank 5 will have the largest priority value (=2), and Bank 0 and Bank 5 will be excluded from refresh candidates.

As described above, according to the second embodiment, bank-designated refresh is executed on banks that do not affect memory access having the largest priority value in the command storage unit 303. With this configuration, it is possible to suppress degradation in performance of memory access having the largest priority value due to refresh operation, making it possible to realize efficient memory access. Note that, similar to the first embodiment, the refresh priority 906 may be omitted.

Third Embodiment

The first embodiment and the second embodiment have described the methods in which the refresh generation unit 307 determines refresh candidates using priority values of access commands. The third embodiment describes a method in which the refresh generation unit 307 excludes a bank to be accessed by an access command having a specific transfer ID and determines refresh candidates. Note that the configuration of the DRAM control apparatus 300 and the processing performed by the refresh generation unit 307 in the third embodiment are the same as those in the first embodiment (FIGS. 3 and 8).

FIG. 12 is a diagram illustrating a method (steps S801 to S803 and S809) for determining refresh candidates by the refresh generation unit 307 according to the third embodiment. The third embodiment describes a case where a bank to be accessed by, for example, an access command whose ID is 1 is excluded and a refresh is issued. In the third embodiment, similar to the first and second embodiments, the refresh priority order 904 is determined based on the sum total 903 of read commands and write commands to other banks. Also, referring to the column of transfer ID 1201 in the example of FIG. 12, an access command having the transfer ID of 1 is included in Bank 0. Accordingly, the refresh generation unit 307 excludes Bank 0 (exclusion bank 905) from the refresh candidates. Eventually, "Bank 2" that is not to be accessed by the access command whose transfer ID is 1 and has the highest refresh priority 904 calculated based on the sum total 903 of read commands and write commands to other bank has the highest refresh priority 906. Thereafter, "Bank 5," "Bank 6," and "Bank 3" are to be refreshed in this order (refresh priority 906).

As described above, according to the third embodiment, the refresh generation unit 307 selects banks that do not affect memory access having a specific transfer ID in the command storage unit 303 and bank-designated refresh is executed thereon. That is, refresh is executed so that memory access to a specific transfer destination is prioritized. Note that although the third embodiment describes a case where a bank of one type of transfer ID is excluded from refresh candidates, it is apparent that banks of multiple types of transfer IDs may also be excluded from refresh candidates. Also, similar to the first embodiment, the refresh priority 906 may be omitted.

Fourth Embodiment

The fourth embodiment describes a method in which the refresh generation unit 307 determines refresh candidates, if access commands are in a dependency relationship and there is an access command to be performed prior to an access command having the largest priority value.

Configuration of Apparatus

Figure 13:
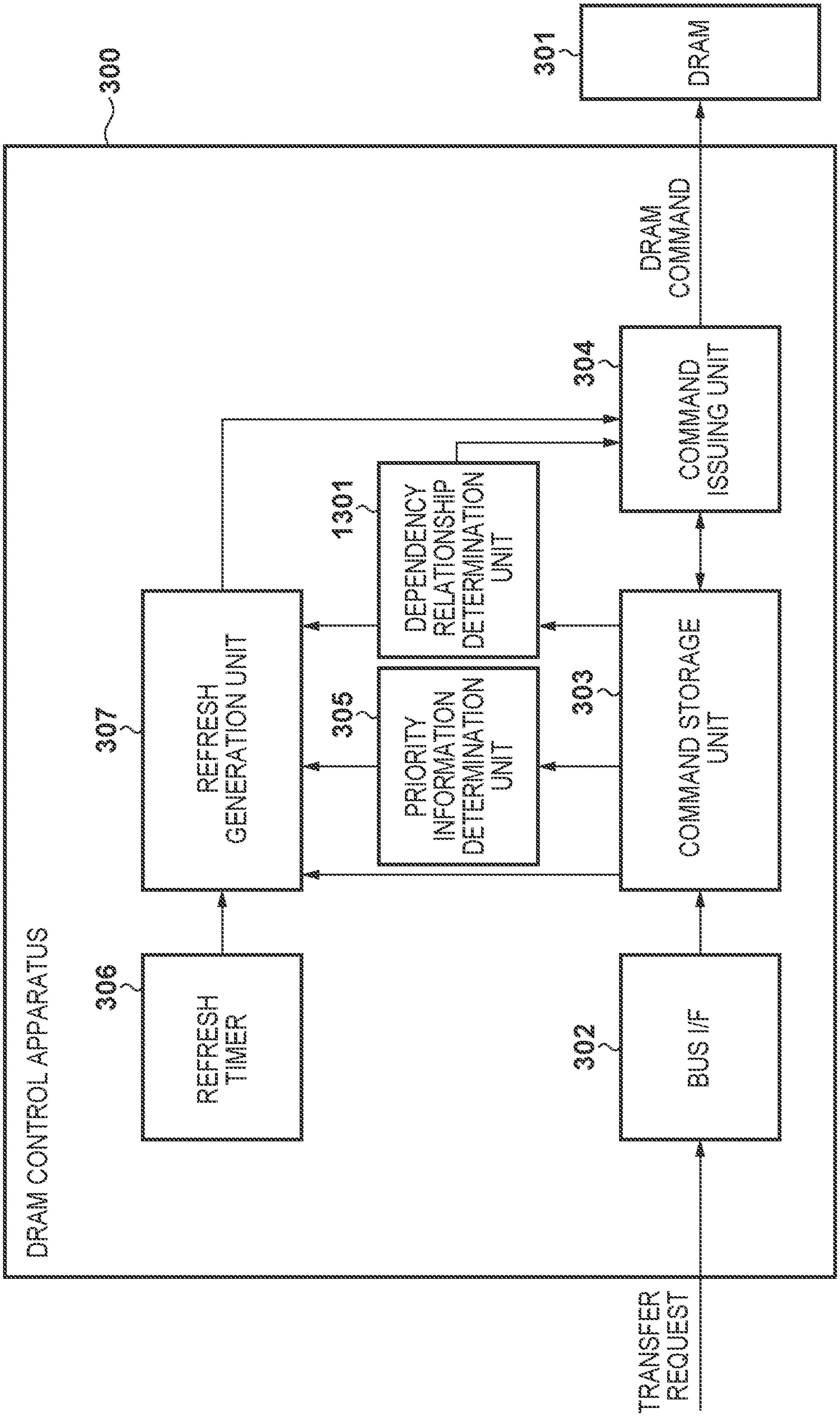
FIG. 13 is a diagram illustrating a configuration of a DRAM control apparatus according to a fourth embodiment.

FIG. 13 is a block diagram illustrating an example of a configuration of a DRAM control apparatus according to a fourth embodiment. The same reference numerals are given to configurations having the same functions as those in the first embodiment (FIG. 3). A dependency relationship determination unit 1301 monitors access commands stored in the command storage unit 303 and notifies the refresh generation unit 307 of a bank to be excluded from refresh candidates. The dependency relationship determination unit 1301 also notifies the command issuing unit 304 of information relating to dependent access commands.

A dependency relationship between access commands will be described with reference to FIG. 4. In the present embodiment, access commands whose access order needs to be maintained are referred to as dependent access commands. First, an example of a method of specifying dependent access commands will be described. FIG. 4 is a diagram showing examples of access commands per row address that are stored in the command storage unit 303. A transfer ID is given to each of the access commands. Accordingly, by analyzing information stored in the command storage unit 303, it is possible to recognize the dependency relationship between access commands. For example, the access commands having the same transfer ID 406 may be determined as dependent access commands (indicated by a dotted line 409). Also, the access commands having the same transfer ID 406 and the same access type 401 may be determined as dependent access commands (indicated by a dotted line 408). In the present embodiment, a case is described in which the access commands having the same transfer ID 406 and the same access type 401 (access commands indicated by the dotted line 408) are determined as dependent access commands.

The command issuing unit 304 receives information on dependent access commands from the dependency relationship determination unit 1301, and issues the access commands so that the dependent access commands are issued in the same order as the order of reception.

FIG. 14 is a diagram illustrating a method (processing in steps S801 to S803 and S809 in FIG. 8) for determining refresh candidates according to the fourth embodiment. Similar to the other embodiments, the refresh generation unit 307 determines the priority order 904 based on the sum total 903 of read commands and write commands to other banks. Similar to the second embodiment, the refresh generation unit 307 excludes, from refresh candidates, a bank having access commands whose priority value given from the priority information determination unit 305 is the greatest. In the present example, Bank 0 is excluded from the refresh candidates. Note that a bank whose priority value is greater than or equal to a predetermined value may be defined as an exclusion bank as in the first embodiment, or a bank having an access command of a specific transfer ID may be defined as an exclusion bank as in the third embodiment.

The dependency relationship determination unit 1301 checks the access type and the transfer ID 1401 of access commands, specifies banks having dependent access commands, and notifies the refresh generation unit 307 of the specified banks. Because dependent access commands need to be issued with the order of reception maintained, the refresh generation unit 307 determines an additional exclusion bank based on the notified dependency relationship.

In the example of FIG. 14, Bank 0 and Bank 5 include access commands whose access type is "read" and whose transfer ID is "0", and the dependency relationship determination unit 1301 determines that the access commands of Bank 0 and Bank 5 are in a dependency relationship. Also, referring to the access command reception order 1402, the access command to Bank 5 has the earlier order. Accordingly, if Bank 0 having the largest priority value is determined as an exclusion bank, the refresh generation unit 307 also excludes, from the refresh candidates, Bank 5 (exclusion bank 905) having the access command that is in a dependency relationship with the access command of Bank 0. Eventually, "Bank 2" that has no dependency relationship and has the largest sum total of read commands and write commands to other banks is determined as a refresh candidate having the highest priority. Thereafter, "Bank 6" and "Bank 3" are determined as refresh candidates (refresh priority 906). Note that although, in the example of FIG. 14, the priority is given to the refresh candidates of Bank 2, Bank 3 and Bank 6, no degradation in memory access performance will occur no matter to which of the three banks a refresh is issued. Accordingly, no priority needs to be given to the refresh candidates of Bank 2, Bank 3 and Bank 6.

Note that, in the description above, processing in which a bank to be accessed by an access command having the largest priority value is selected as an exclusion bank (second embodiment) has been used, but the present invention is not limited to this. For example, processing in which a bank to be accessed by an access command whose priority value is greater than or equal to a predetermined threshold is regarded as an exclusion bank (first embodiment) may be used, or processing in which a bank to be accessed by an access command having a predetermined transfer ID is regarded as an exclusion bank (third embodiment) may be used. Also, in the description above, the order of reception of dependent access commands has been taken into consideration, but the present invention is not limited to this. For example, a bank having an access command that is in a dependency relationship with the access command of an exclusion bank selected based on the priority value may be regarded as an exclusion bank, regardless of the order of reception of the dependent access commands. Also, a bank determined as a bank to be excluded based on the priority value is further determined based on its dependency relationship, but the present invention is not limited to this. For example, a configuration is also possible in which all banks to be accessed by dependent access commands are added to the exclusion banks selected using the methods of first to third embodiments.

Note that when the buffer of the command storage unit 303 is empty, there is no memory access and there is no need of taking into consideration degradation in memory access performance due to refresh, and thus all banks are set as refresh candidates.

As described above, according to the fourth embodiment, a bank to be accessed by an access command that is in a dependency relationship with an access command that is to access a bank excluded from refresh candidates based on the priority value and the like is also excluded from the refresh candidates. For example, a bank to be accessed by an access command that needs to be issued earlier than an access command that is to access a bank excluded from refresh candidates based on the priority value and the like is also excluded from the refresh candidates. As a result of refresh being executed while avoiding banks to which dependent access commands are to access, deterioration in impact of an access command with the highest priority value due to refresh issuance is reduced, for example.

Note that the present embodiment has described the refresh candidate determination method executed when a bank is excluded from refresh candidates, but a refresh candidate determination method other than this determination method is also applicable.

According to the present invention, issuance of refresh requests is controlled so that more efficient memory access is possible.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2023-066619, filed Apr. 14, 2023 which is hereby incorporated by reference herein in its entirety.

What is claimed is:

1. A memory control apparatus that controls access to a DRAM including a plurality of banks, the memory control apparatus comprising:
- a first generation unit configured to generate an access command in response to an access request for the DRAM, and store the generated access command in a buffer;
- a second generation unit configured to generate a bank-designated refresh request for the DRAM; and
- an issuing unit configured to issue a DRAM command to the DRAM based on the access command stored in the buffer and the refresh request generated by the second generation unit,
- wherein the access command stored in the buffer includes attribute information added by an initiator, the attribute information comprising at least one of:
- (i) a priority value represented by an integer indicating urgency of the access request, and
- (ii) a transfer ID indicating a task associated with data transferred by the access command,
- wherein the second generation unit:
  - calculates, for each bank of the plurality of banks, a total number of commands to the other banks based on address information and a transfer length of the access commands stored in the buffer,
  - selects, as refresh candidates, banks for which the calculated total number of commands is greater than or equal to a predetermined number,
  - determines an exclusion bank based on the attribute information included in the access commands stored in the buffer by:
    - excluding a bank to be accessed by an access command whose priority value is greater than or equal to a threshold; and
  - determines a bank to which the bank-designated refresh request is to be given from among banks remaining after the determined exclusion bank has been excluded from the banks selected as refresh candidates.

2. The memory control apparatus according to claim 1,
- wherein the second generation unit further specifies access commands whose order of issuance needs to be maintained as dependent access commands, and
- the second generation unit further excludes a bank to be accessed by the dependent access commands when determining the bank to which the bank-designated refresh request is to be given.

3. The memory control apparatus according to claim 2,
- wherein in a case where a first access command and a second access command, which is to be issued earlier than the first access command, are in a dependency relationship, and the first access command is to access the exclusion bank, the second generation unit also selects a bank to be accessed by the second access command as the exclusion bank.

4. The memory control apparatus according to claim 2, wherein the dependent access commands include a plurality of access commands that are of the same type with respect to reading and writing and share the same transfer ID.

5. The memory control apparatus according to claim 1, further comprising, a control unit configured to control an order of issuance of access commands stored in the buffer, wherein the control unit excludes an access command that is to access a bank that is being refreshed, from access commands to be subjected to the control of an order of issuance.

6. A memory control method executed by a memory control apparatus that controls access to a DRAM including a plurality of banks, the memory control method comprising:

a first generation step of generating an access command in response to an access request for the DRAM, and storing the generated access command in a buffer;

a second generation step of generating a bank-designated refresh request for the DRAM; and an issuing step of issuing a DRAM command to the DRAM based on the access command stored in the buffer and the refresh request generated in the second generation step, wherein the access command stored in the buffer includes attribute information added by an initiator, the attribute information comprising at least one of:

(i) a priority value represented by an integer indicating urgency of the access request, and (ii) a transfer ID indicating a task associated with data transferred by the access command, wherein the second generation step comprises:

calculating, for each bank of the plurality of banks, a total number of commands to the other banks based on address information and a transfer length of the access commands stored in the buffer, selecting, as refresh candidates, banks for which the calculated total number of commands is greater than or equal to a predetermined number, determining an exclusion bank based on the attribute information included in the access commands stored in the buffer by:

excluding a bank to be accessed by an access command whose priority value is greater than or equal to a threshold; and determining a bank to which the bank-designated refresh request is to be given from among banks remaining after the determined exclusion bank has been excluded from the banks selected as refresh candidates.

7. The memory control apparatus according to claim 1, wherein in calculating the total number of commands for each bank, the total number is calculated by counting, for each access command, a number obtained by dividing a transfer length by a base burst length.

8. The memory control apparatus according to claim 1, wherein in selecting banks as refresh candidates, the predetermined number corresponds to a number of access commands that can be issued to banks other than a focused bank during a refresh period of the focused bank.

* * * * *